United States Patent
Kamal et al.

(10) Patent No.: US 9,147,438 B2
(45) Date of Patent: Sep. 29, 2015

(54) MONOLITHIC THREE DIMENSIONAL (3D) INTEGRATED CIRCUITS (ICS) (3DICS) WITH VERTICAL MEMORY COMPONENTS, RELATED SYSTEMS AND METHODS

(71) Applicant: QUALCOMM Incorporated, San Diego, CA (US)

(72) Inventors: Pratyush Kamal, San Diego, CA (US); Yang Du, Carlsbad, CA (US); Kambiz Samadi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/152,248

(22) Filed: Jan. 10, 2014

(65) Prior Publication Data
US 2015/0109843 A1   Apr. 23, 2015

Related U.S. Application Data

(60) Provisional application No. 61/894,541, filed on Oct. 23, 2013.

(51) Int. Cl.
| | |
|---|---|
| G11C 17/00 | (2006.01) |
| G11C 5/02 | (2006.01) |
| H04L 12/933 | (2013.01) |
| H01L 23/00 | (2006.01) |
| G06F 1/32 | (2006.01) |
| H01L 27/06 | (2006.01) |

(52) U.S. Cl.
CPC ............... *G11C 5/02* (2013.01); *G06F 1/3225* (2013.01); *G06F 1/3275* (2013.01); *H01L 24/89* (2013.01); *H01L 27/0688* (2013.01); *H04L 49/101* (2013.01); *H04L 49/109* (2013.01); *H01L 2924/1434* (2013.01)

(58) Field of Classification Search
CPC ..................................... G11C 5/02; G11C 8/08
USPC ................................................. 365/51, 230.06
See application file for complete search history.

(56) References Cited

U.S. PATENT DOCUMENTS 6,999,854 B2 * 2/2006 Roth .............................. 700/282
7,763,978 B2   7/2010 Wu et al.
(Continued)

OTHER PUBLICATIONS

Liu C., et al., "Ultra-High Density 3D SRAM Cell Designs for Monolithic 3D Integration," IEEE International Interconnect Technology Conference (IITC), 2012, pp. 1-3.
(Continued)

*Primary Examiner* — Michael Tran
(74) *Attorney, Agent, or Firm* — Withrow & Terranova, PLLC

(57) ABSTRACT

Monolithic three dimensional (3D) integrated circuits (ICs) (3DICs) with vertical memory components are disclosed. A 3D memory crossbar architecture with tight-pitched vertical monolithic intertier vias (MIVs) for inter-block routing and multiplexers at each tier for block access is used to shorten overall conductor length and reduce resistive-capacitive (RC) delay. Elimination of such long crossbars reduces the RC delay of the crossbar and generally improves performance and speed. Further, elimination of the long horizontal crossbars makes conductor routing easier. The MIVs, with their small run-length, can work without the need for repeaters (unlike the long crossbars), and control logic may be used to configure the memory banks based on use.

21 Claims, 7 Drawing Sheets

(56) References Cited

U.S. PATENT DOCUMENTS

| | | | |
|---|---|---|---|
| 7,982,504 B1 | 7/2011 | Robinett | |
| 8,059,443 B2 | 11/2011 | McLaren et al. | |
| 8,410,617 B2 | 4/2013 | Leedy | |
| 8,537,634 B2 * | 9/2013 | Muralimanohar et al. | 365/230.03 |
| 2010/0191999 A1 | 7/2010 | Jeddeloh | |
| 2011/0161748 A1 | 6/2011 | Casper et al. | |
| 2012/0275210 A1 * | 11/2012 | Yan et al. | 365/148 |

OTHER PUBLICATIONS

International Search Report and Written Opinion for PCT/US2014/060578, mailed Feb. 10, 2015, 14 pages.

Panth, S. et al., "High-Density Integration of Functional Models Using Monolithic 3D-IC Technology," 18th Asia and South Pacific Design Automation Conference (ASP-DAC), Jan. 22-25, 2013, Yokohama, Japan, IEEE, pp. 681-686.

* cited by examiner

MONOLITHIC THREE DIMENSIONAL (3D) INTEGRATED CIRCUITS (ICS) (3DICS) WITH VERTICAL MEMORY COMPONENTS, RELATED SYSTEMS AND METHODS

PRIORITY CLAIM

The present application claims priority to U.S. Provisional Patent Application Ser. No. 61/894,541 filed on Oct. 23, 2013 and entitled "MONOLITHIC THREE DIMENSIONAL (3D) INTEGRATED CIRCUITS (ICs) (3DICs) WITH VERTICAL MEMORY COMPONENTS, RELATED SYSTEMS AND METHODS," which is incorporated herein by reference in its entirety.

BACKGROUND

I. Field of the Disclosure

The technology of the disclosure relates generally to memory systems in integrated circuits.

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. The limited space contributes pressure to a continued miniaturization of components and control of power consumption within the circuitry. While miniaturization has been of particular concern in the integrated circuits (ICs) of mobile communication devices, efforts at miniaturization of ICs in other devices also occur.

While miniaturization efforts have progressed in general compliance with Moore's Law, the space savings achieved by shrinking the active components are almost immediately offset by IC designs that add additional active elements to provide increased functionality. In conventional two dimensional (2D) designs, active elements within an IC have all been placed in a single active layer with elements interconnected through one or more metal layers that are also within the IC. As the number of active elements within an IC increases, the routing requirements to effectuate desired interconnections between elements become increasingly complex.

The difficulty in routing interconnections is particularly acute within the memory elements. That is, while smaller memory bit cells do allow component miniaturization, increased functionality requires more available memory and accordingly, more and more memory bit cells are assembled into memory banks for each device. As the number of memory bit cells within a memory bank increases, the access lines (such as the bit line (BL) or word line (WL)) for such bit cells become increasingly long. As the length of the access lines becomes longer, the difficulty in routing the lines increases. Normally, memory banks may make use of a fully-static complementary metal oxide semiconductor (CMOS) fabric switch consisting on inter-block routes, multiplexers and repeaters for client-to-client interaction. The use of such a fabric switch allows the memory pools to save metal route congestion. Even with such fabric switches, memory pools require crossbars (sometimes referred to as "xBar") as inter-block communication channels in 2D designs. These crossbars take up significant routing resources that compete with top-level routes. Additionally, these crossbars are typically millimeter(s) long. Such lengths necessitate the use of repeaters, and have significant resistive-capacitive (RC) delay associated with them, limiting the memory access (or inter-block communication) time.

SUMMARY OF THE DISCLOSURE

Embodiments disclosed in the detailed description include monolithic three dimensional (3D) integrated circuits (ICs) (3DICs) with vertical memory components. Related systems and methods are also disclosed. A vertical memory component, as used herein, is a plurality of memory cells arranged in vertically stacked tiers within an IC. 3DICs can provide significant advantage in terms of arranging the memory blocks and reducing the inter-block wire lengths through the use of a vertical crossbar. Reduction of the inter-block wire lengths may reduce the resistive-capacitive (RC) delay.

In this regard, in one exemplary embodiment, a 3DIC is disclosed. The 3DIC comprises a memory structure. The memory structure comprises a plurality of tiers, each tier having a memory cell. The memory structure also comprises a plurality of MIVs spanning the plurality of tiers. The memory structure also comprises a first multiplexer disposed in a first tier among the plurality of tiers and coupled to at least a respective memory cell within the first tier of the plurality of tiers. The memory structure also comprises a second multiplexer disposed in a second tier among the plurality of tiers and coupled to at least a second respective memory cell within the second tier of the plurality of tiers. The memory structure also comprises control logic configured to determine which, if any, memory cells are active and reconfigure usage of memory cells based on such determination.

In another exemplary embodiment, a 3DIC is disclosed. The 3DIC comprises a plurality of tiers, each tier comprising one or more client memory units. The 3DIC also comprises a vertical crossbar coupling the client memory units and allowing communication therebetween. The vertical crossbar comprises a plurality of MIVs spanning the plurality of tiers. The vertical crossbar also comprises at least one multiplexer associated with each of the plurality of tiers. The vertical crossbar also comprises control logic configured to determine which, if any, client memory units are active and reconfigure usage of client memory units based on such determination.

In another exemplary embodiment, a method of forming a memory structure in a 3DIC is disclosed. The method comprises positioning a first client memory unit on a first tier of a 3DIC. The method also comprises positioning a second client memory unit on a second tier of the 3DIC. The method also comprises coupling the first client memory unit to the second client memory unit with a vertical crossbar. The method also comprises providing control logic configured to determine which, if any, memory cells within the client memory units are active and reconfigure usage of memory cells based on such determination.

In another exemplary embodiment a 3DIC is disclosed. The 3DIC comprises a memory structure. The memory structure comprises a plurality of tiers, each tier having a memory cell. The memory structure also comprises a plurality of MIVs spanning the plurality of tiers. The memory structure also comprises a first means for multiplexing disposed in a first tier among the plurality of tiers and coupled to at least a respective memory cell within the first tier of the plurality of tiers. The memory structure also comprises a second means for multiplexing disposed in a second tier among the plurality of tiers and coupled to at least a second respective memory cell within the second tier of the plurality of tiers. The memory structure also comprises means for controlling configured to determine which, if any, memory cells are active and reconfigure usage of memory cells based on such determination.

In another exemplary embodiment, a 3DIC is disclosed. The 3DIC comprises a plurality of tiers, each tier having a memory cell. The 3DIC also comprises a plurality of MIVs spanning the plurality of tiers. The 3DIC also comprises a first multiplexer disposed in a first tier among the plurality of tiers and coupled to at least a respective memory cell within the first tier of the plurality of tiers. The 3DIC also comprises a second multiplexer disposed in a second tier among the plurality of tiers and coupled to at least a second respective memory cell within the second tier of the plurality of tiers. The 3DIC also comprises control logic coupled to at least one of the plurality of MIV, the control logic configured to determine which, if any, memory cells are active and reconfigure usage of memory cells based on such determination

DETAILED DESCRIPTION

Figure 1:
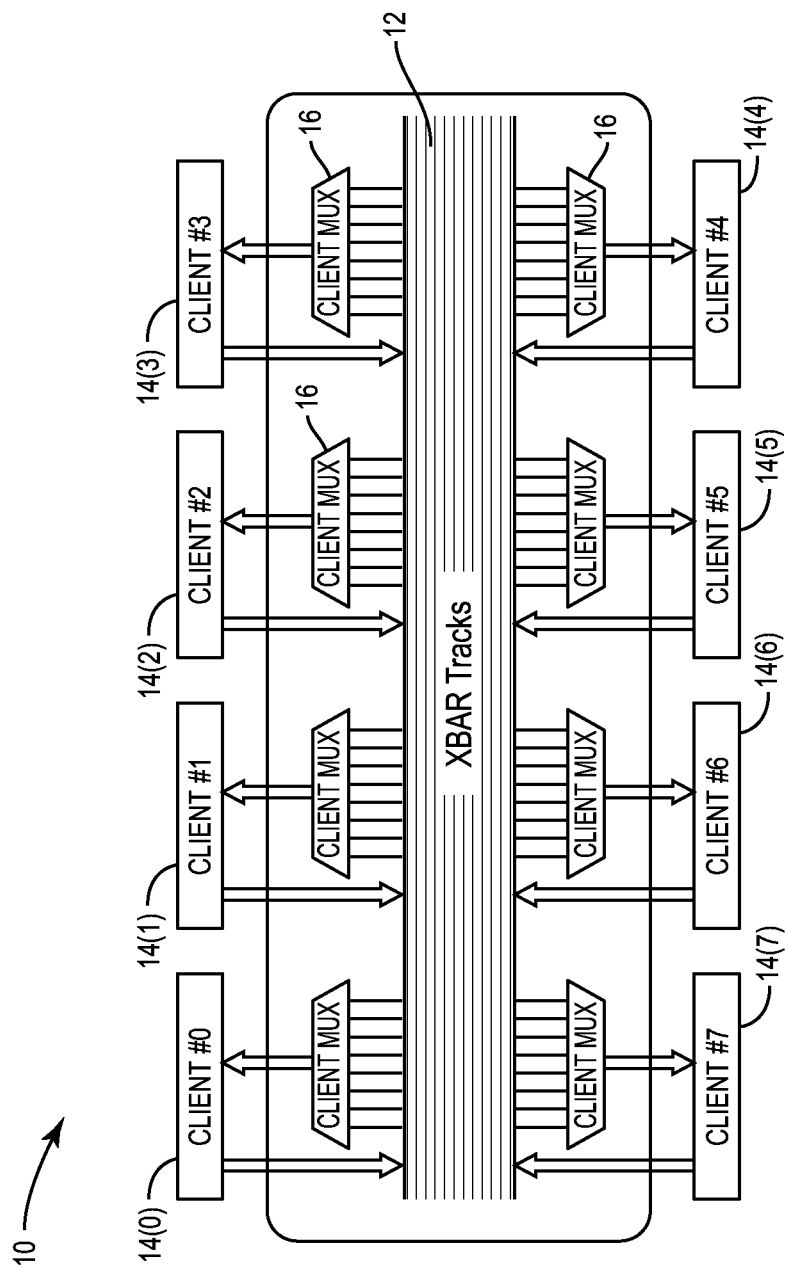
FIG. 1 is a block diagram of an exemplary conventional memory block with a shuffle crossbar architecture for a horizontal memory structure.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include monolithic three dimensional (3D) integrated circuits (ICs) (3DICs) with vertical memory components. Related systems and methods are also disclosed. A vertical memory component, as used herein, is a plurality of memory cells arranged in vertically stacked tiers within an IC. 3DICs can provide significant advantage in terms of arranging the memory blocks and reducing the inter-block wire lengths through the use of a vertical crossbar. Reduction of the inter-block wire lengths may reduce the resistive-capacitive (RC) delay.

In this regard, embodiments disclosed herein include a 3D memory crossbar architecture with tight-pitched vertical monolithic intertier vias (MIVs) for inter-block routing and multiplexers at each tier of a 3DIC for block access. Because the vertical distance between tiers of the 3DIC is relatively short, longer horizontal crossbars can be reduced or eliminated. Elimination of such longer crossbars reduces the RC delay of the crossbar and generally improves performance and speed. Further, elimination of longer horizontal crossbars makes conductor routing easier. The MIVs, with their smaller run-lengths, reduce the need to rely on repeaters (unlike the long crossbars), and control logic may be used to configure the memory banks based on use.

Before addressing embodiments of 3D vertical memory banks that can be employed in 3DIC in such a manner that conserves area within the IC and reduces RC delay, a brief overview of conventional two dimensional (2D) memory banks is first provided below with reference to FIGS. 1 and 2. Discussion of 3D vertical memory banks according to exemplary embodiments of the present disclosure begins below with reference to FIG. 3.

In this regard, FIG. 1 is a shuffle style crossbar architecture for a memory structure 10. The memory structure 10 includes a horizontal crossbar 12 and client memory units 14. As illustrated, there are eight client memory units 14(0)-14(7), although this may be abstracted to N client memory units 14. Each client memory unit 14 has K bits (not illustrated explicitly). With a shuffle style crossbar, each client memory unit 14 may send to and receive from every other client memory unit 14. To effectuate this communication, the horizontal crossbar 12 includes N×K tracks, and each client memory unit 14 is associated with a respective multiplexer (MUX) 16 (also referred to herein as a means for multiplexing). As the number of client memory units 14 (i.e., N) grows or the number of bits within each client memory unit 14 grows (i.e., K), the number of tracks grows. As the number of tracks grows, the harder it is to find enough area within the IC to place and route the tracks. As a consequence, the length of the horizontal crossbar 12 grows. As the length of the horizontal crossbar grows, the RC delays associated with the horizontal crossbar grows and repeaters (not shown) may be required to make sure that a signal arrives at the appropriate destination. Furthermore, a long horizontal crossbar 12 may have electromagnetic interference (EMI) issues which negatively impact performance. While adequate for relatively small numbers of client memory units 14, memory structure 10 with its horizontal crossbar 12 quickly becomes impractical in larger memory structures.

Figure 2:
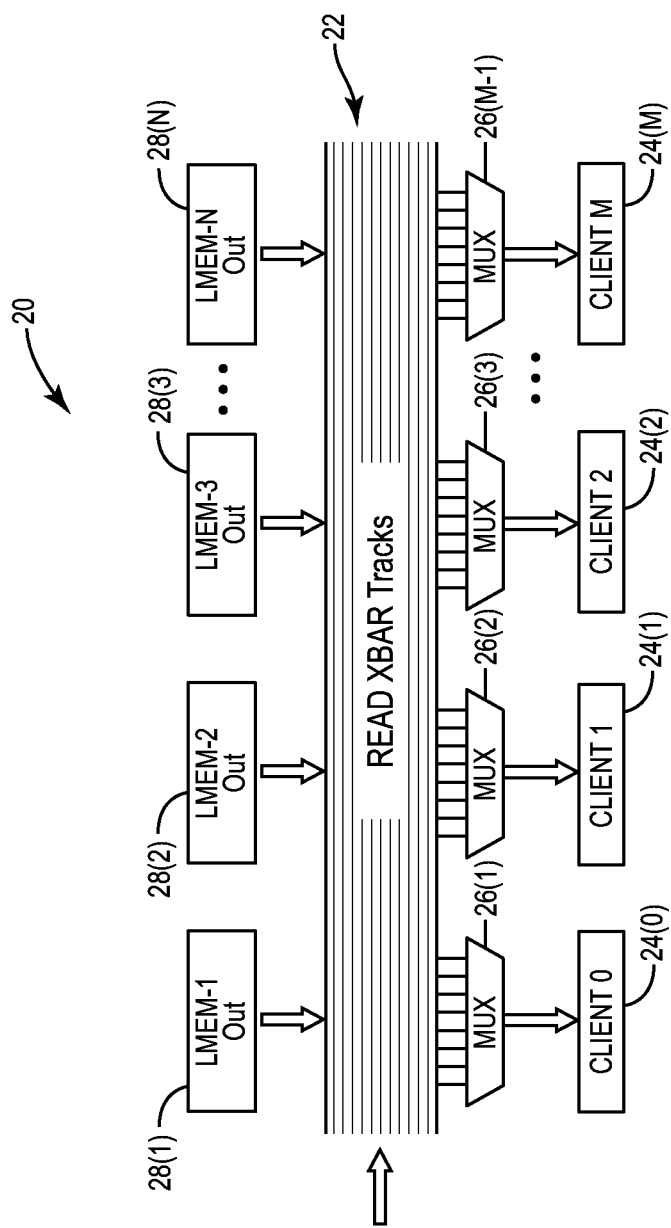
FIG. 2 is a block diagram of an exemplary conventional memory block with an in-out crossbar architecture for a horizontal memory structure.

Similar to FIG. 1, FIG. 2 illustrates an in-out style crossbar architecture for a memory structure 20. The memory structure 20 includes a horizontal crossbar 22 and client memory units 24. In an exemplary embodiment, there are M client memory units 24(1)-24(M) with K bits available for each client. A MUX 26 is associated with each client memory unit 24 (i.e., MUX 26(0)-26(M−1)). Likewise, there are N read clients 28 (i.e., clients 28(1)-28(N)). Thus, the horizontal crossbar 22 is N×M with N×K tracks. Such an arrangement has client memory units 24 dedicated to listening and read clients 28 dedicated to talking. As with the memory structure 10 of FIG. 1, this arrangement will lead to practical limitations in terms of routing congestion and increased RC delay.

As noted above, the 2D horizontal crossbars 12, 22 with numerous tracks create excessive routing complexity for all the tracks. Additionally, the longer the tracks get, the more RC delay is introduced into the operation of the memory. Such delay is generally undesirable.

In contrast to the 2D memory structures 10, 20 with horizontal crossbars 12, 22, embodiments disclosed herein include a 3D vertical memory bank as discussed in more detail below. In an exemplary embodiment, the 3D memory bank is provided within a monolithic 3DIC with MIV interconnecting tiers within the 3DIC. The use of a 3DIC allows placement of client memory units in a way that allows the elimination of long inter-block routes. The MIVs replace such long inter-block routes. Because the MIVs are shorter, there is less RC delay. For example, inter-block routes may be millimeters long. In contrast, MIVs may be microns long. These shorter paths significantly reduce RC delay as well as metal routing congestion. Additionally, the shorter MIVs may operate without the need for repeaters Elimination of repeaters saves space and expense in the IC. Additionally, elimination of repeaters also leads to improved memory access times. Accordingly, elimination of repeaters is a positive change in the circuit design.

Figure 3:
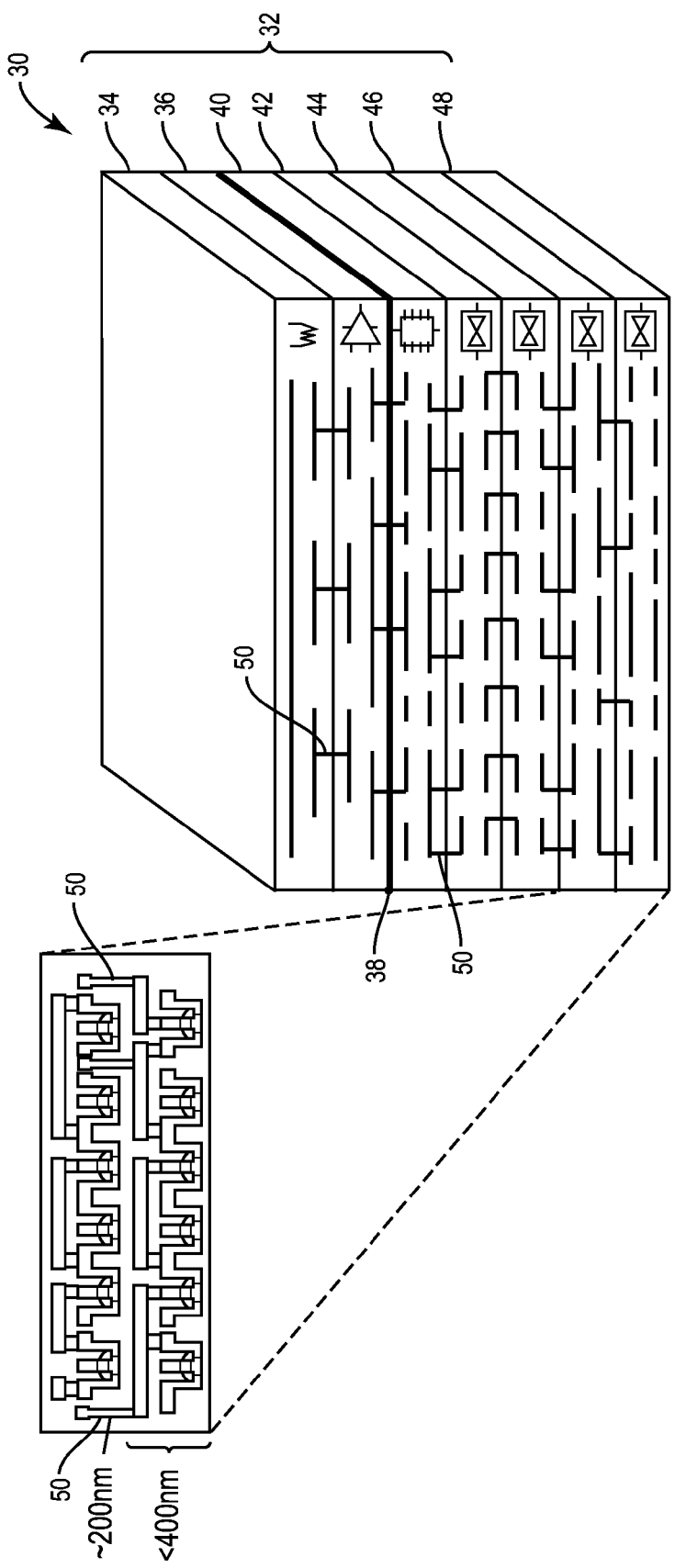
FIG. 3 is a simplified illustration of a three dimensional (3D) integrated circuit (IC) (3DIC) that may include a vertical memory component arranged in a 3D memory bank according to exemplary embodiments of the present disclosure.
Figure 4:
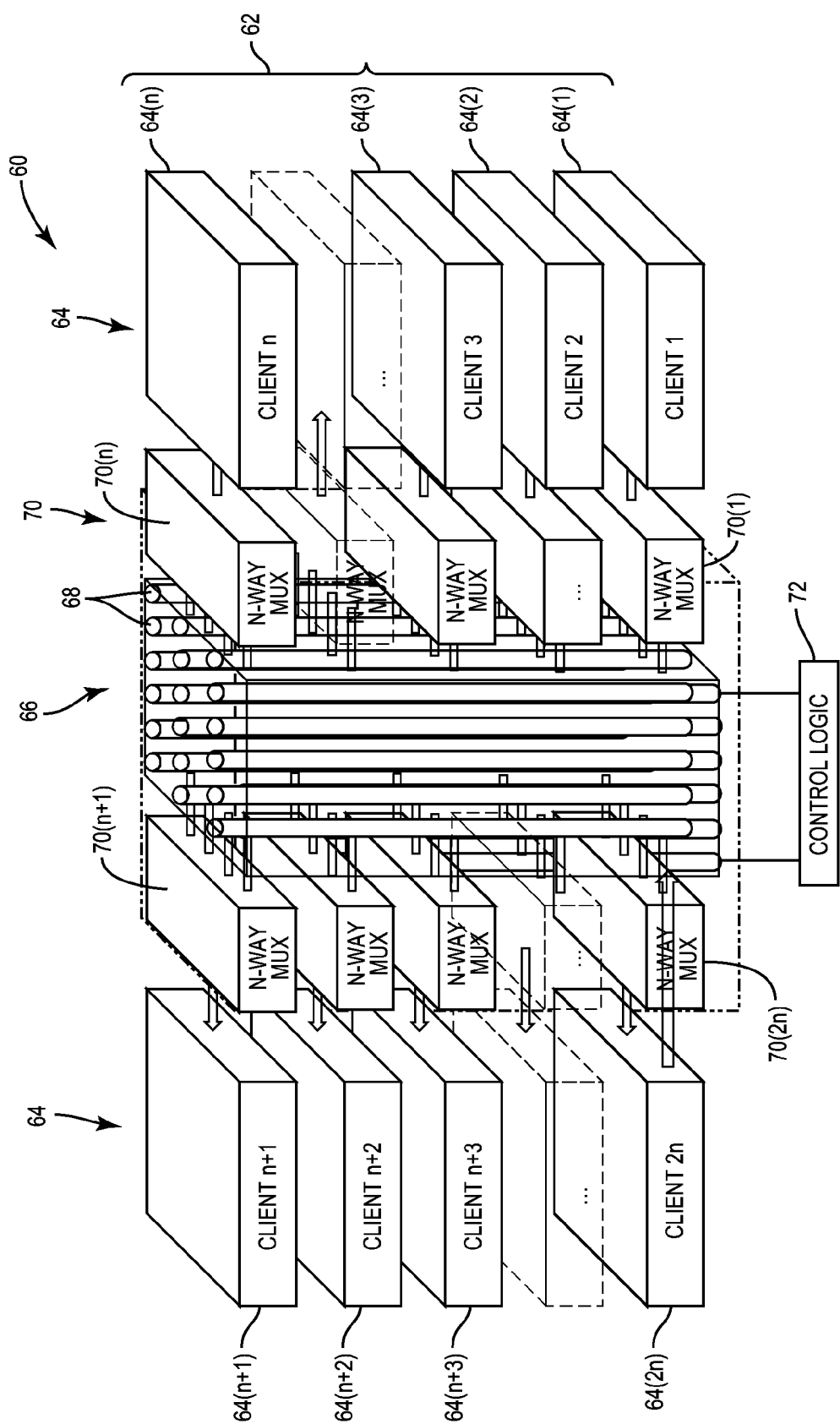
FIG. 4 is a simplified illustration of an exemplary embodiment of a 3D vertical memory structure that can be employed as the 3D memory bank in the 3DIC in FIG. 3.

Before explaining exemplary embodiments of vertical memory structures in a 3DIC, a brief overview of a 3DIC 30 is provided with reference to FIG. 3. In this regard, FIG. 3 illustrates a simplified cross-section of a 3DIC 30. The 3DIC 30 has multiple tiers 32. The tiers 32 may be formed by hydrogen cutting or other monolithic tier formation method. For more information on an exemplary hydrogen cutting process, the interested reader is referred to U.S. patent application Ser. No. 13/765,080, filed Feb. 12, 2013, which is herein incorporated by reference in its entirety.

As noted above, the use of 3DIC technology allows different tiers of the tiers 32 within the 3DIC 30 to perform different functions and provide all the functions of a particular device in a single 3DIC 30. For example, the 3DIC 30 may be a RF transceiver and controller for a mobile terminal. Thus, a first tier 34 includes sensors and other large feature size elements.

With continued reference to FIG. 3, a second tier 36 may include radio frequency, analog and/or power management integrated circuit (PMIC) components. The second tier 36 may be designed to be relatively low noise so that incoming RF analog signals are not distorted. An electromagnetic (EM) shield 38 may be positioned between the second tier 36 and a third tier 40. The EM shield 38 may be formed from a conductive material such as a graphene layer. For more information about graphene shields in 3DIC, the interested reader is referred to U.S. patent application Ser. No. 13/765,061, filed Feb. 12, 2013, the disclosure of which is herein incorporated by reference in its entirety.

The presence of the EM shield 38 helps prevent noise from the first and second tiers 34, 36 from affecting the low noise characteristics of the third tier 40. The third tier 40 may have a modem or other controller. To accommodate the functions on the third tier 40, the materials and design of the third tier 40 may be selected to promote a medium speed architecture.

With continued reference to FIG. 3, fourth through seventh tiers 42, 44, 46, and 48 may be a memory tiers that include memory structures according to exemplary embodiments of the present disclosure as further explained below with reference to FIGS. 4 through 8.

In an exemplary embodiment, the tiers of the 3DIC 30 are electrically intercoupled by MIV 50. For more information about MIV, the interested reader is referred to "High-Density Integration of Functional Modules Using Monolithic 3D-IC Technology" by Shreedpad Panth et al. in the proceedings of the IEEE/ACM Asia South Pacific Design Automation Conference, 2013; pp. 681-686 which is hereby incorporated by reference in its entirety. In contrast to TSV, MIV may be on the order of sub 100 nm in diameter (i.e., much smaller than the micron dimensions of the TSV) and 200 nm or less depth.

Further, in an exemplary embodiment, each of the multiple tiers 32 may be approximately 400 nm thick or thinner. These dimensions are illustrated in the inset of FIG. 3.

In this regard, FIGS. 4 through 8 offer exemplary embodiments of 3D memory structure that may be used in a 3DIC such as 3DIC 10. The 3D memory structures consume relatively little area within the 3DIC compared to a comparable amount of memory implemented in 2D. Additionally, the long horizontal crossbars of the 2D structures are eliminated which reduces the RC delay. In this regard, with reference to FIG. 4, a first exemplary embodiment of a 3D memory structure 60 is provided. The memory structure 60 has 'N' tiers 62 with client memory units 64 (also referred to herein as memory cells) positioned on either side of vertical crossbar 66. Thus, there are 2N client memory units 64(1)-64(2n). The client memory units 64 are arranged in a "butterfly" arrangement (i.e., the vertical crossbar 66 is the thorax, and the client memory units 64 form the wings). By placing the client memory units 64 on two sides of the vertical crossbar 66, the total footprint of the 3D memory structure 60 has generally rectangular shape with a long x dimension and a relatively short y dimension. This rectangular footprint may be appropriate for certain circuit layouts while preserving the relatively short vertical crossbar structure, which reduces the RC delay.

Figure 5:
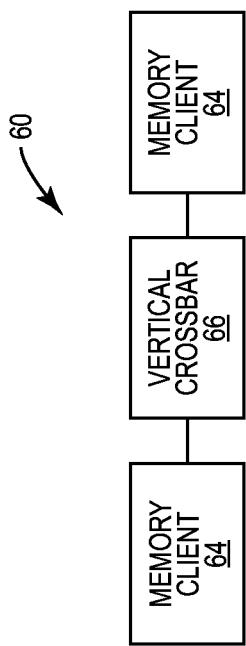
FIG. 5 is a simplified top down view of the 3D vertical memory structure of FIG. 4 with two memory banks per tier.

FIG. 5 provides a top down view of the memory structure 60. Returning to FIG. 4, the vertical crossbar 66 may be formed from a plurality of MIV 68 and multiplexers 70. In an exemplary embodiment, each client memory unit 64(1)-64(2n) has a respective MUX 70(1)-70(2n). Each MUX 70 may be an N×1 MUX. Control logic 72 (also referred to as a means for controlling) may be positioned in a tier different from the tiers 62 (e.g., below the lowest tier 62 or above the highest tier 62) or may be incorporated into one of the tiers 62. In another exemplary embodiment, the control logic 72 may be distributed and incorporated into or co-located with each MUX 70. The control logic 72 operates to determine which client memory units 64 are active and reconfigure use of the memory structure 60 accordingly. Specifically, if particular client memory units 64 are not active, the control logic 72 may deactivate such unused client memory units 64. Deactivation of such unused client memory units 64 conserves power, which is particularly advantageous in mobile devices that rely on batteries for power.

Figure 7:
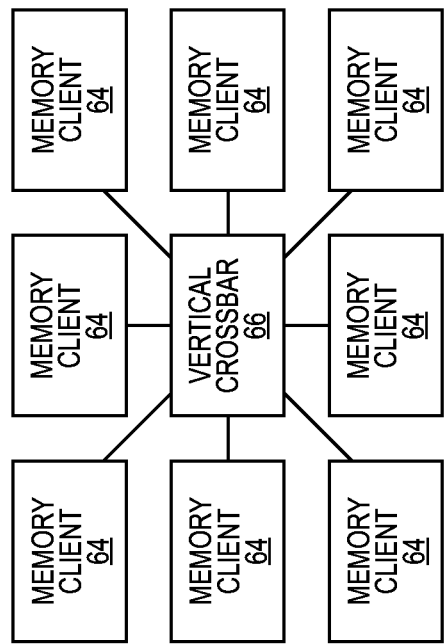
FIG. 7 is simplified top down view of another exemplary embodiment of a 3D vertical memory structure with eight memory banks per tier.
Figure 6:
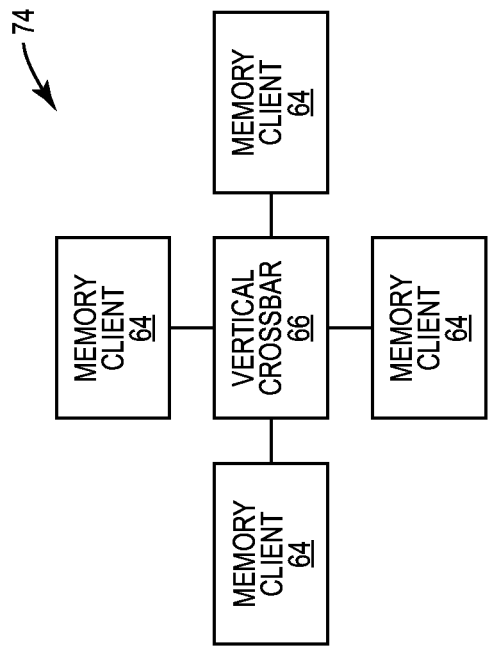
FIG. 6 is a simplified top down view of an exemplary embodiment of a 3D vertical memory structure with four memory banks per tier.

FIGS. 6 and 7 illustrate other exemplary embodiments of 3D memory structures 74 and 76, respectively that maintain the vertical crossbar while providing different design options in terms of area consumed versus total memory provided. In contrast to the 3D memory structure 60 of FIGS. 4 and 5, memory structure 74 of FIG. 6 has client memory units 64 on each side of the vertical crossbar 66 (for a total of four client memory units 64 in each tier). The vertical crossbar 66 remains short, but more total memory is provided compared to the 3D memory structure 60 of FIGS. 4 and 5. Additionally, the cross-like or + shaped appearance may be better suited for some design layouts. Likewise, the memory structure 76 of FIG. 7 has eight (8) client memory units 64 on each tier. Using eight client memory units 64 may provide more total memory, but at the expense of a slightly larger footprint. However, the square footprint of memory structure 76 may be better suited for some design layouts. However, even with the eight client memory units 64 on each tier, the vertical crossbar 66 remains relatively short with a corresponding reduction in RC delay. In still another embodiment (not illustrated) some tiers may have differing numbers of client memory units 64 than other tiers (e.g., first and second tiers have two client memory units 64, third and fifth tiers have eight client memory units 64, and fourth tier has four client memory units 64). Such arrangements may facilitate particular design constraints (e.g., space, timing, and/or routing constraints) as needed or desired.

Figure 8:
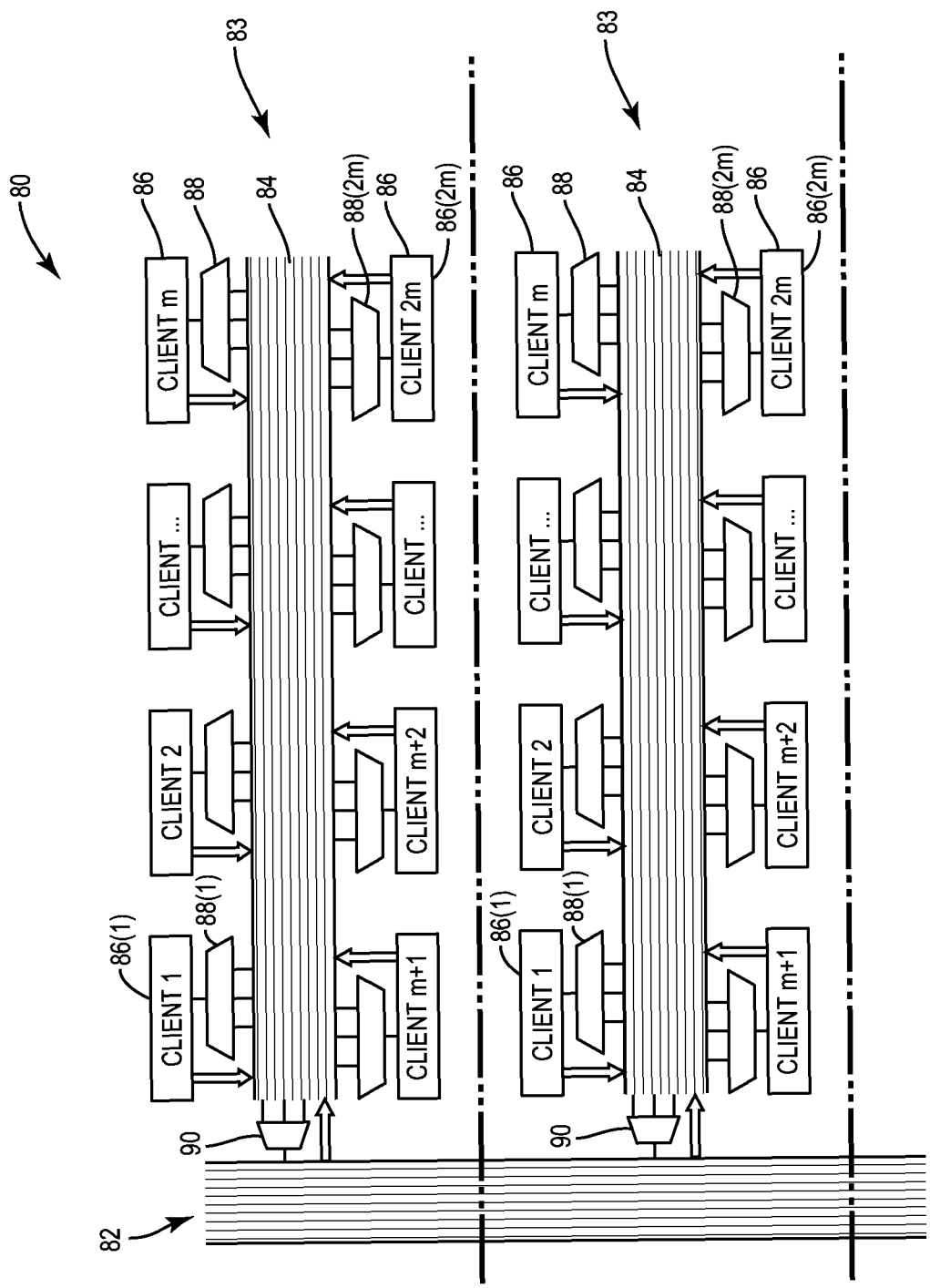
FIG. 8 is a simplified diagram of an alternate exemplary embodiment of a 3D vertical memory structure for use in a 3DIC with both vertical and horizontal crossbars.

While the embodiments of FIGS. 4-7 each have utility for different design criteria, still other design criteria may not be met by such structures. Accordingly, an additional exemplary embodiment of a memory structure 80 is provided in FIG. 8 illustrating a vertical memory structure. Memory structure 80 may include a vertical crossbar 82 which may be formed from multiple MIV as described above and spans a plurality of tiers 83 within the memory structure 80. Furthermore, memory structure 80 may have horizontal crossbars 84 that couple the vertical crossbar 82 to client memory units 86. In an exemplary embodiment there are 2m client memory units 86 (e.g., 86(1)-86(2m)). Each client memory unit 86(1)-86(2m) may have a respective MUX 88 (e.g., MUX 88(1)-88(2m )). Additionally, each tier 83 may have a MUX 90 coupling the vertical crossbar 82 to the respective horizontal crossbar 84. In an exemplary embodiment, there are 2m client memory units 86 per tier, with each client memory unit 86 having k bits. Thus, the horizontal crossbar 84 may have 2m*k conductive lines. The MUX 88 may be 2m×1 MUX. The vertical crossbar 82 may have k MIV therein. The MUX 90 may be 2m×1 MUX. Again, selection of the memory structure 80 over one of the other memory structures may be a function of design criteria such as space or routing constraints. Again, control logic may be used to determine which client memory units 86 are active and selectively deactivate inactive client memory units 86.

While the above discussion has focused on how the crossbar interconnects the memory units, it should be appreciated that the crossbar also couples to the control logic (e.g., control logic 72), which may be on a different tier than the memory units or located in a tier with one or more memory units.

The memory structures with vertical crossbars according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 9:
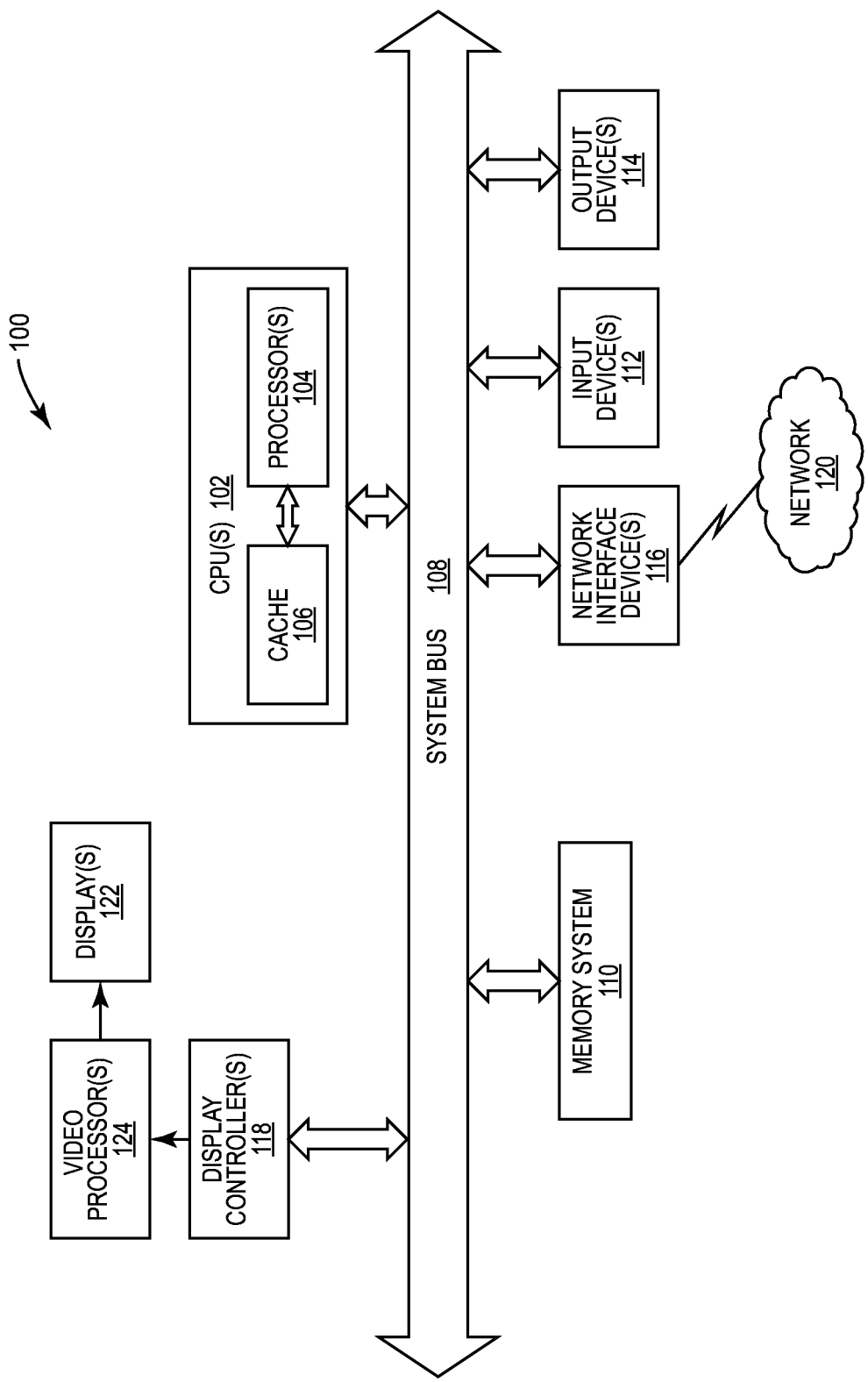
FIG. 9 is a block diagram of an exemplary processor-based system that can include the vertical memory structures of FIGS. 4 through 8.

In this regard, FIG. 9 illustrates an example of a processor-based system 100 that can employ the monolithic 3DIC with vertical memory components illustrated in FIGS. 4 through 8. In this example, the processor-based system 100 includes one or more central processing units (CPUs) 102, each including one or more processors 104. The CPU(s) 102 may have cache memory 106 coupled to the processor(s) 104 for rapid access to temporarily stored data. The cache memory 106 may include one or more of the 3DIC containing the vertical crossbars described above. The CPU(s) 102 is coupled to a system bus 108 and can intercouple devices included in the processor-based system 100. As is well known, the CPU(s) 102 communicates with these other devices by exchanging address, control, and data information over the system bus 108.

Other devices can be connected to the system bus 108. As illustrated in FIG. 9, these devices can include a memory system 110 which would include the memory structures of the present disclosure, one or more input devices 112, one or more output devices 114, one or more network interface devices 116, and one or more display controllers 118, as examples. The input device(s) 112 can include any type of input device, including but not limited to input keys, switches, voice processors, etc. The output device(s) 114 can include any type of output device, including but not limited to audio, video, other visual indicators, etc. The network interface device(s) 116 can be any devices configured to allow exchange of data to and from a network 120. The network 120 can be any type of network, including but not limited to a wired or wireless network, private or public network, a local area network (LAN), a wide local area network (WLAN), and the Internet. The network interface device(s) 116 can be configured to support any type of communication protocol desired.

The CPU(s) 102 may also be configured to access the display controller(s) 118 over the system bus 108 to control information sent to one or more displays 122. The display controller(s) 118 sends information to the display(s) 122 to be displayed via one or more video processors 124, which process the information to be displayed into a format suitable for the display(s) 122. The display(s) 122 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three dimensional (3 D) integrated circuit (IC) (3 DIC), comprising:
   a memory structure comprising:
      a plurality of tiers, each tier having a memory cell;
      a plurality of monolithic intertier vias (MIVs) spanning the plurality of tiers;
      a first multiplexer disposed in a first tier among the plurality of tiers and coupled to at least a respective memory cell within the first tier of the plurality of tiers;
      a second multiplexer disposed in a second tier among the plurality of tiers and coupled to at least a second respective memory cell within the second tier of the plurality of tiers; and
      control logic configured to determine which, if any, memory cells are active and reconfigure usage of memory cells based on such determination.

2. The 3 DIC of claim 1, wherein the control logic configured to reconfigure usage of memory cells deactivates unused memory cells so that power is conserved.

3. The 3 DIC of claim 1, wherein the plurality of MIVs are configured to act as crossbars for the memory structure.

4. The 3 DIC of claim 1, wherein the memory cell comprises random access memory (RAM).

5. The 3 DIC of claim 4, wherein the RAM comprises static RAM (SRAM).

6. The 3 DIC of claim 1, wherein the plurality of tiers comprises 2n memory banks, wherein the plurality of tiers comprises n tiers.

7. The 3 DIC of claim 1, wherein the plurality of MIVs comprise a vertical length on the order of microns long.

8. The 3 DIC of claim 1, further comprising at least one horizontal crossbar for memory cells within the first tier.

9. A three dimensional (3 D) integrated circuit (IC) 3 DIC, comprising:
   a plurality of tiers, each tier comprising one or more client memory units;
   a vertical crossbar coupling the client memory units and allowing communication therebetween, the vertical crossbar comprising:
      a plurality of monolithic intertier vias (MIVs) spanning the plurality of tiers; and
      at least one multiplexer associated with each of the plurality of tiers; and
   control logic configured to determine which, if any, client memory units are active and reconfigure usage of client memory units based on such determination.

10. The 3 DIC of claim 9, wherein the control logic configured to determine which client memory units are active reconfigures usage of client memory units by deactivating client memory units which are not active.

11. The 3 DIC of claim 9, further comprising a horizontal crossbar associated with a first tier of the plurality of tiers, wherein the horizontal crossbar couples a plurality of client memory units within a single tier to the vertical crossbar.

12. The 3 DIC of claim 9, wherein each client memory unit comprises random access memory (RAM).

13. The 3 DIC of claim 12, wherein the RAM comprises static RAM (SRAM).

14. The 3 DIC of claim 9, wherein at least one tier comprises eight client memory units.

15. The 3 DIC of claim 14, wherein the vertical crossbar is centrally disposed amongst the eight client memory units.

16. The 3 DIC of claim 9, wherein the vertical crossbar supports a shuffle architecture.

17. The 3 DIC of claim 9, wherein the vertical crossbar supports an in/out architecture.

18. A method of forming a 3 D memory structure in a three dimensional (3 D) integrated circuit (IC) (3 DIC), comprising:
   positioning a first client memory unit on a first tier of a 3 DIC;
   positioning a second client memory unit on a second tier of the 3DIC;
   coupling the first client memory unit to the second client memory unit with a vertical crossbar; and
   providing control logic configured to determine which, if any, memory cells within the first and second client memory units are active and reconfigure usage of the client memory units based on such determination by deactivating client memory units which are not active.

19. The method of claim 18, further comprising deactivating the client memory units that are not active as determined by the control logic.

20. The method of claim 18, further comprising providing at least one horizontal crossbar within one of the client memory units.

21. A three dimensional (3 D) integrated circuit (IC) (3 DIC), comprising:
   a plurality of tiers, each tier having a memory cell;
   a plurality of monolithic intertier vias (MIVs) spanning the plurality of tiers;
   a first multiplexer disposed in a first tier among the plurality of tiers and coupled to at least a respective memory cell within the first tier of the plurality of tiers;

a second multiplexer disposed in a second tier among the plurality of tiers and coupled to at least a second respective memory cell within the second tier of the plurality of tiers; and control logic coupled to at least one of the plurality of MIV, the control logic configured to determine which, if any, memory cells are active and reconfigure usage of memory cells based on such determination.

* * * * *